(12) United States Patent
Pyo et al.

(10) Patent No.: US 9,515,127 B2
(45) Date of Patent: Dec. 6, 2016

(54) ORGANIC ELECTROLUMINESCENT DISPLAY APPARATUS

(71) Applicant: Samsung Display Co., Ltd., Yongin (KR)

(72) Inventors: Sangwoo Pyo, Hwaseong-si (KR); Hajin Song, Hwaseong-si (KR); Heunseung Lee, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/817,563

(22) Filed: Aug. 4, 2015

(65) Prior Publication Data

US 2016/0218154 A1    Jul. 28, 2016

(30) Foreign Application Priority Data

Jan. 23, 2015  (KR) .................. 10-2015-0011523

(51) Int. Cl.
*H01L 27/32* (2006.01)
*H01L 51/52* (2006.01)
*H01L 51/50* (2006.01)

(52) U.S. Cl.
CPC ....... *H01L 27/3211* (2013.01); *H01L 51/5004* (2013.01); *H01L 51/5265* (2013.01); *H01L 2251/552* (2013.01)

(58) Field of Classification Search
None
See application file for complete search history.

(56) References Cited

U.S. PATENT DOCUMENTS

| | | | | |
|---|---|---|---|---|
| 8,053,975 | B2 * | 11/2011 | Chun | .......... H01L 27/3211 313/504 |
| 8,581,270 | B2 * | 11/2013 | Park | .......... H01L 27/3211 257/40 |
| 9,006,713 | B2 | 4/2015 | Park et al. | |
| 9,048,456 | B2 | 6/2015 | Chang et al. | |
| 2005/0186330 | A1 * | 8/2005 | Kim | .......... H01L 51/0017 427/66 |
| 2008/0284324 | A1 * | 11/2008 | Chun | .......... H01L 27/3211 313/504 |
| 2011/0240970 | A1 * | 10/2011 | Park | .......... H01L 27/3211 257/40 |
| 2013/0001526 | A1 | 1/2013 | Kwak et al. | |

(Continued)

FOREIGN PATENT DOCUMENTS

KR    10-2013-0007279    1/2013
KR    10-2013-0007307    1/2013
(Continued)

*Primary Examiner* — Lex Malsawma
(74) *Attorney, Agent, or Firm* — H.C. Park & Associates, PLC

(57) ABSTRACT

An organic electroluminescent display apparatus includes: a base substrate; a first electrode; a hole transport region; a light-emitting unit; a common layer; a first resonance auxiliary layer; a second resonance auxiliary layer; an electron transport region; and a second electrode. The light-emitting unit includes a first light-emitting layer disposed on the first pixel region and a second light-emitting layer disposed on the second pixel region. The first resonance auxiliary layer and the second resonance auxiliary layer may be separated from the common layer.

9 Claims, 5 Drawing Sheets

(56) References Cited

U.S. PATENT DOCUMENTS

| | | | |
|---|---|---|---|
| 2013/0001532 A1* | 1/2013 | Hwang | H01L 51/0058 257/40 |
| 2014/0027732 A1 | 1/2014 | Pyo et al. | |
| 2014/0291627 A1* | 10/2014 | Kim | H01L 51/0013 257/40 |
| 2015/0001480 A1* | 1/2015 | Kim | H01L 51/5265 257/40 |

FOREIGN PATENT DOCUMENTS

| | | |
|---|---|---|
| KR | 10-2013-0007308 | 1/2013 |
| KR | 10-2013-0072032 | 7/2013 |
| KR | 10-2014-0013513 | 2/2014 |

* cited by examiner

ORGANIC ELECTROLUMINESCENT DISPLAY APPARATUS

CROSS-REFERENCE TO RELATED APPLICATION

This application claims priority from and the benefit of Korean Patent Application No. 10-2015-0011523, filed on Jan. 23, 2015, which is hereby incorporated by reference for all purposes as if fully set forth herein.

BACKGROUND

1. Field

Exemplary embodiments relate to an organic electroluminescent display apparatus, and more particularly, to an organic electroluminescent display apparatus having high luminous efficiency, improved longevity, and improved display quality.

2. Discussion of the Background

An organic light-emitting diode has a high response speed, is driven at low voltage, and is self-emitting. Accordingly, since an organic electroluminescent display apparatus including the organic light-emitting diode does not need a separate light source, the organic electroluminescent display apparatus has several advantageous features, such as being lightweight and thin, while also having excellent brightness and a wide viewing angle.

The organic light-emitting diode is a display element that has a light-emitting unit including an organic material between an anode electrode and a cathode electrode. Holes supplied from the anode electrode and electrons supplied from the cathode electrode are combined in the light-emitting unit to form excitons, and then light corresponding to energy between the holes and the electrons is generated from the excitons.

The above information disclosed in this Background section is only for enhancement of understanding of the background of the inventive concept, and, therefore, it may contain information that does not form the prior art that is already known in this country to a person of ordinary skill in the art.

SUMMARY

An exemplary embodiment provides an organic electroluminescent display apparatus improved in luminous efficiency, longevity, and display quality.

Additional aspects will be set forth in the detailed description which follows, and, in part, will be apparent from the disclosure, or may be learned by practice of the inventive concept.

An exemplary embodiment discloses an organic electroluminescent display apparatus including: a base substrate including a first pixel region and a second pixel region; a first electrode disposed on the base substrate; a hole transport region disposed on the first electrode; a light-emitting unit disposed on the hole transport region, and including a first light-emitting layer disposed on the first pixel region and a second light-emitting layer disposed on the second pixel region; a common layer disposed between the light-emitting unit and the hole transport region; a first resonance auxiliary layer disposed on the first pixel region, and disposed between the common layer and the hole transport region; a second resonance auxiliary layer disposed on the second pixel region, and disposed between the second light-emitting layer and the common layer; an electron transport region disposed on the light-emitting unit; and a second electrode disposed on the electron transport region.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
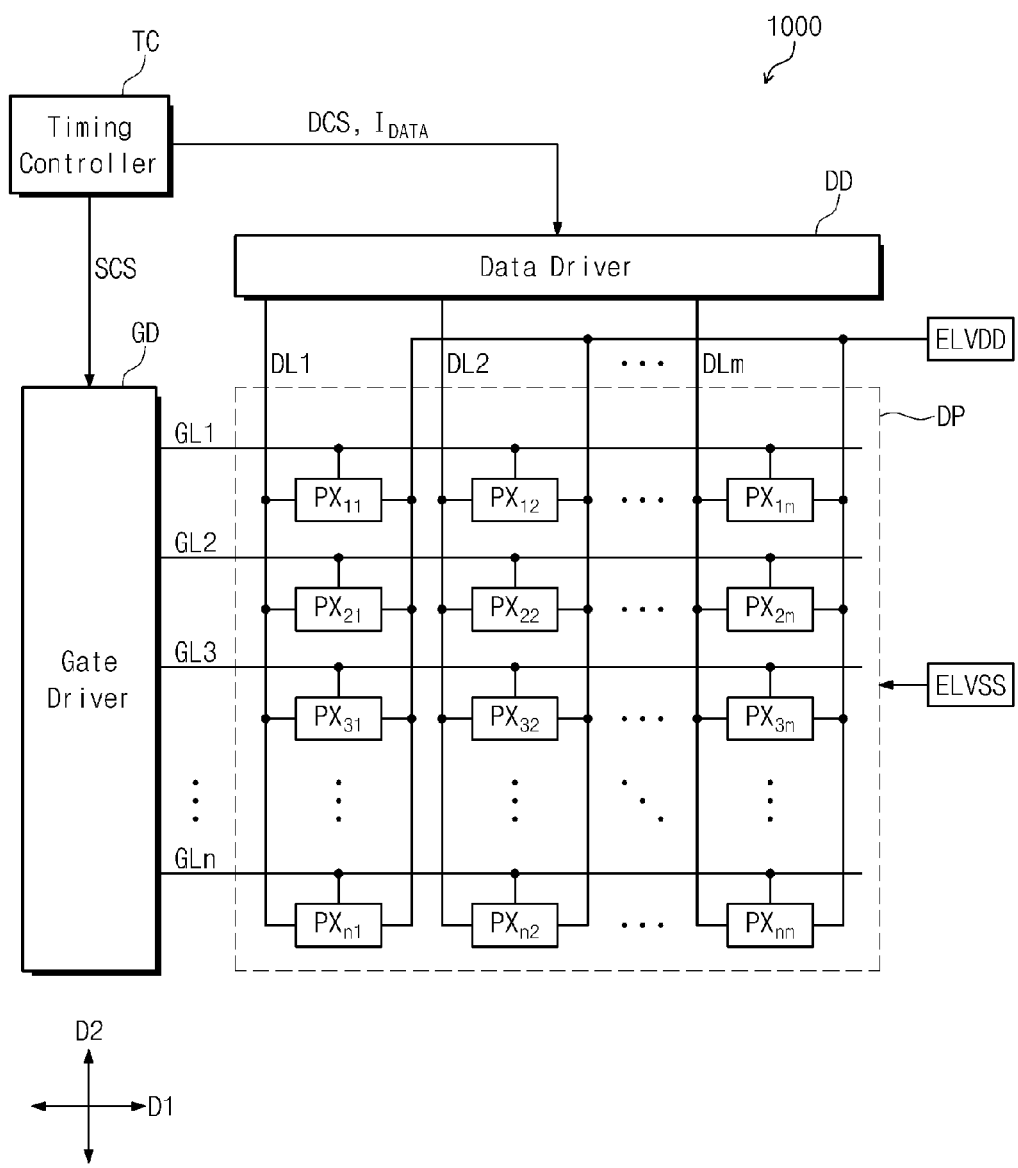
FIG. 1 is a block diagram showing a display apparatus according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
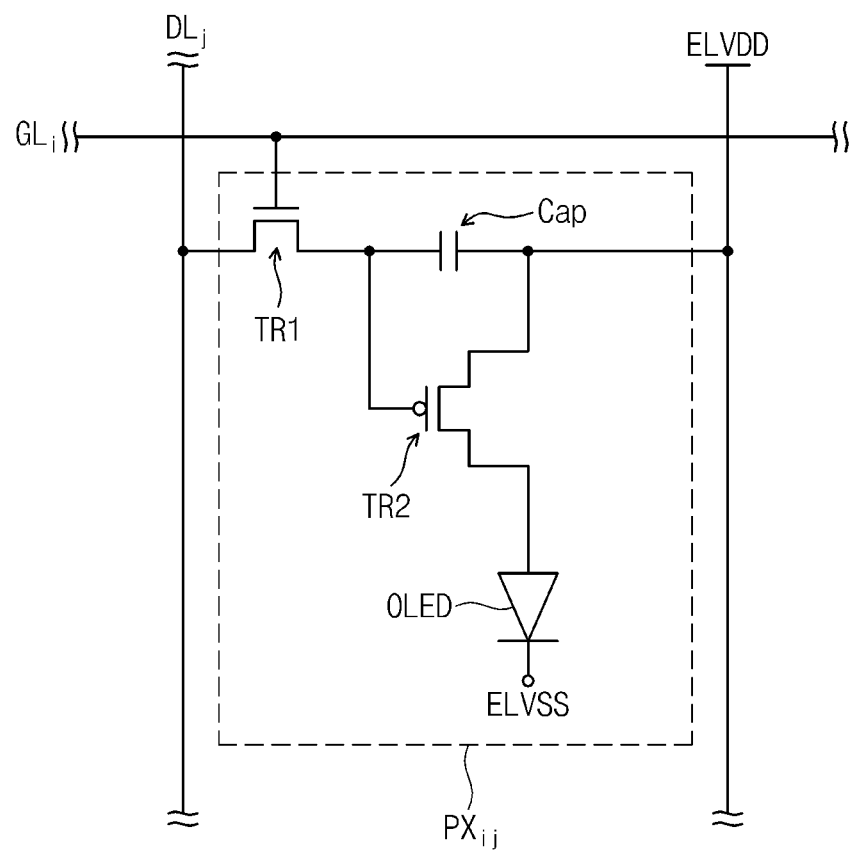
FIG. 2 is an equivalent circuit diagram of a pixel shown in FIG. 1.

FIG. 1 is a block diagram showing a display apparatus according to an exemplary embodiment, and FIG. 2 is an equivalent circuit diagram of a pixel shown in FIG. 1.

Referring to FIGS. 1 and 2, an organic electroluminescent display apparatus 1000 may include a display panel DP, a timing controller TC, a gate driver GD, and a data driver DD.

The timing controller TC may receive input image signals, and output an image data $I_{DATA}$ converted so as to correspond to a driving mode of the display panel DP, and various control signals SCS and DCS.

The gate driver GD may receive a gate driving control signal SCS from the timing controller TC. The gate driver GD receiving the gate driving control signal SCS may generate gate signals. The gate signals may be sequentially supplied to the display panel DP.

The data driver DD may receive the data driving control signal DCS and the image data $I_{DATA}$ from the timing controller TC. The data driver DD may generate data signals on the basis of the data driving control signal DCS and the image data $I_{DATA}$. The data signals may be supplied to the display panel DP.

The display panel DP may receive an electric signal from an external source to display an image. The display panel DP includes gate lines GL1 to GLn, data lines DL1 to DLm, and pixels $PX_{11}$ to $PX_{nm}$.

Each of the gate lines GL1 to GLm may extend in a first direction D1, and the gate lines GL1 to GLm may be arranged in a second direction D2 intersecting with the first direction D1. The gate lines GL1 to GLn may sequentially receive gate signals from the gate driver GD.

The data lines DL1 to DLm may be insulated from the gate lines GL1 to GLn, and intersect with the gate lines GL1 to GLn. Each of the data lines DL1 to DLm may extend in the second direction D2, and the data lines DL1 to DLm may be arranged in the first direction D1. The data lines DL1 to DLm may receive data signals from the data driver DD.

The display panel DP may receive first power voltage ELVDD and second power voltage ELVSS from an external source. Each of the pixels $PX_{11}$ to $PX_{nm}$ may respond to a corresponding gate signal to be turned on. Each of the pixels $PX_{11}$ to $PX_{nm}$ may receive the first power voltage ELVDD and the second power voltage ELVSS, and may respond to a corresponding data signal to generate light. The first power voltage ELVDD may be higher than the second power voltage ELVSS.

In an exemplary embodiment, the pixels $PX_{11}$ to $PX_{nm}$ may be arranged in, but are not limited to, a matrix configuration. Each of the pixels $PX_{11}$ to $PX_{nm}$ is connected to a corresponding gate line of the gate lines GL1 to GLn, and is connected to a corresponding data line of the data lines DL1 to DLm.

Each of the pixels $PX_{11}$ to $PX_{nm}$ may receive a gate signal from the corresponding gate line, and receive a data signal from the corresponding data line. Each of the pixels $PX_{11}$ to $PX_{nm}$ may respond to the corresponding gate signal to be turned on. Each of the pixels $PX_{11}$ to $PX_{nm}$ may generate light corresponding to the corresponding data signal to display an image.

Each of pixels $PX_{11}$ to $PX_{nm}$ may include at least one transistor, at least one capacitor, and an organic light-emitting diode.

FIG. 2 shows an exemplary embodiment of an equivalent circuit of a pixel $PX_{ij}$ that is connected to an i-th gate line Gi of the plurality of gate lines GL1 to GLn and a j-th data line Dj of the plurality of data lines DL1 to DLm. The pixel $PX_{ij}$ includes a first transistor TR1, a second transistor TR2, a capacitor Cap, and an organic light-emitting diode OLED as a display element.

The first transistor TR1 may include a control electrode connected to the gate line GLi, an input electrode connected to the data line DLj, and an output electrode. The first transistor TR1 may respond to a gate signal flowing in the gate line GLi to output a data signal flowing in the data line DLj.

The capacitor Cap may include a first capacitor electrode connected to the first transistor TR1 and a second capacitor electrode receiving the first power voltage ELVDD. The capacitor Cap may store electric charges corresponding to a difference between a voltage corresponding to the data signal received from the first transistor TR1 and the first power voltage ELVDD.

The second transistor TR2 may include a control electrode connected to the output electrode of the first transistor TR1 and the first capacitor electrode of the capacitor Cap, an input electrode receiving the first power voltage ELVDD, and an output electrode. The output electrode of the second transistor TR2 may be electrically connected to the organic light-emitting diode OLED.

The second transistor TR2 may respond to electric charges stored in the capacitor Cap to control a driving current flowing in the organic light-emitting diode (OLED). A turn-on time of the second transistor TR2 may be determined according to electric charges stored in the capacitor Cap. The output electrode of the second transistor TR2 may supply a voltage lower than the second power voltage ELVDD to the organic light-emitting diode OLED.

The organic light-emitting diode OLED is connected to the second transistor TR2, and receives the second power voltage ELVSS. The organic light-emitting diode OLED may emit light during a turn-on interval of the second transistor TR2.

The organic light-emitting diode OLED may include a luminous material. The organic light-emitting device OLED may generate light having a color (i.e., light at different wavelengths) corresponding to the luminous material. The light generated in the light-emitting device OLED may have, for example, any one of red, green, blue, and white. Details with respect to the organic light-emitting device OLED will be described later.

Figure 3:
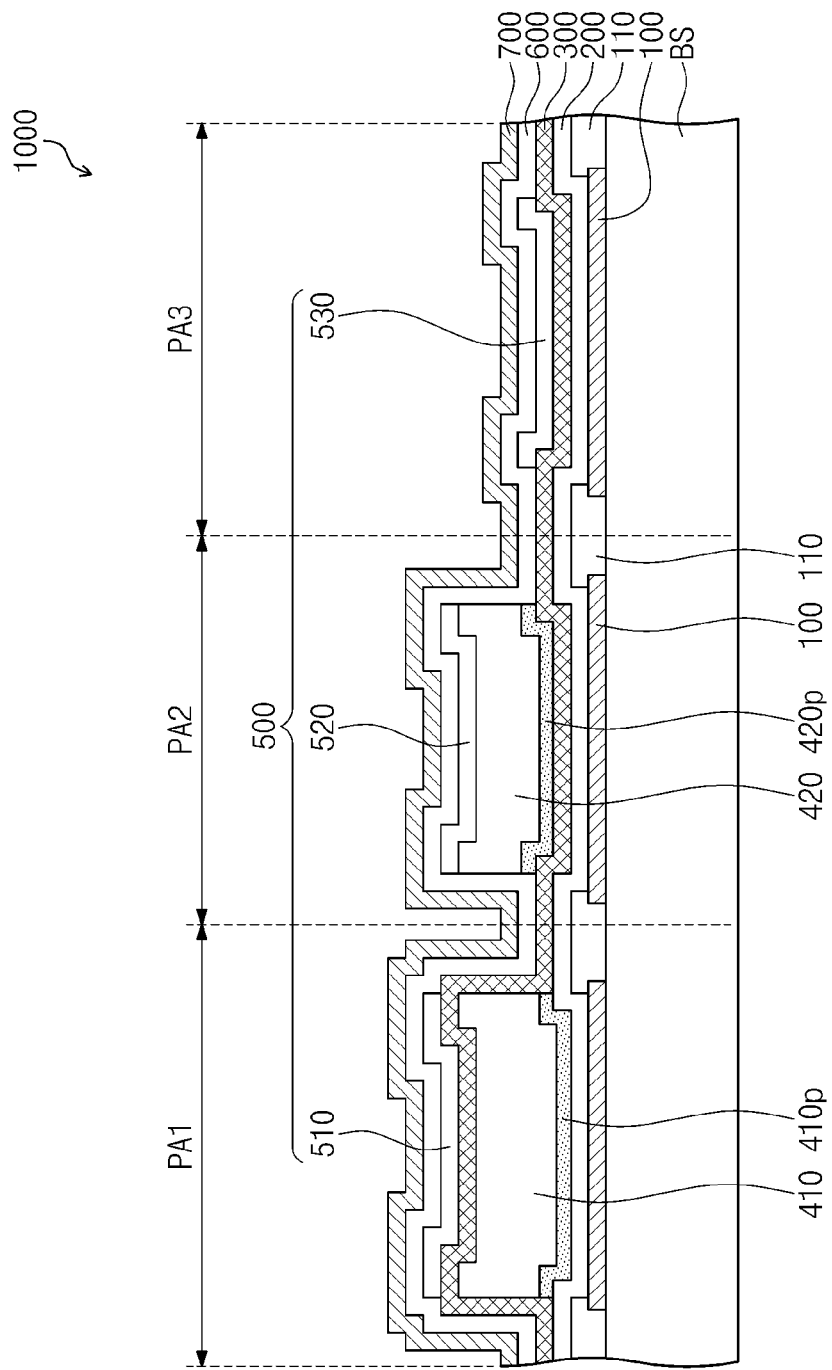
FIG. 3 is a schematic cross-sectional view illustrating a display apparatus according to an exemplary embodiment.

FIG. 3 is a cross-sectional view illustrating a display apparatus according to an exemplary embodiment.

Referring to FIG. 3, an organic electroluminescent display apparatus 1000 may include a base substrate BS, a first electrode 100, a hole transport region 200, a common layer 300, a first resonance auxiliary layer 410, a second resonance auxiliary layer 420, a light-emitting unit 500, an electron transport region 600, and a second electrode 700. The first electrode 100, the hole transport region 200, the common layer 300, the first resonance auxiliary layer 410, the second resonance auxiliary layer 420, the light-emitting unit 500, the electron transport region 600, and the second electrode 700 may be referred to as an organic light-emitting diode (OLED of FIG. 2).

The base substrate BS may include a first pixel region PA1, a second pixel region PA2, and a third pixel region PA3. A plurality of thin films (not shown) may be disposed on the base substrate BS. The thin films may include an inorganic thin film and/or an organic thin film.

The thin films may include a first transistor TR1, a second transistor TR2, a capacitor Cap, and insulation films disposed between the first transistor TR1, the second transistor TR2, and the capacitor Cap, which are illustrated in FIG. 2.

The first electrode 100 may be disposed on the base substrate BS. Although not shown, the first electrode 100 may be electrically connected to a second transistor (TR2 of FIG. 2). In this case, the first electrode 100 may be electrically connected to the second transistor (TR2 of FIG. 2) through a through-hole (not shown) or the like.

The first electrode 100 may be a pixel electrode or an anode electrode. The first electrode 100 may be formed of a material having a high work function such that holes are easily injected.

The first electrode 100 may include a conductive material. The first electrode 100 may be a transparent electrode, a semi-transparent electrode, or a reflective electrode. The first electrode 100 is not limited to any one embodiment, but may be formed of various materials according to a structure of the organic light-emitting diode (OLED of FIG. 2).

When the first electrode 100 is a transparent electrode, the first electrode may be formed of a transparent metal oxide, for example, indium tin oxide (ITO), indium zinc oxide (IZO), zinc oxide (ZnO), or indium tin zinc oxide (ITZO). When the first electrode 100 is a semi-transparent electrode or a reflective electrode, the first electrode 100 may include silver (Ag), magnesium (Mg), aluminum (Al), platinum (Pt), palladium (Pd), gold (Au), nickel (Ni), neodymium (Nd), iridium (Ir), chromium (Cr), or a mixture of a metal.

The first electrode 100 may have a single-layered structure or a multi-layered structure which includes a transparent metal oxide or a metal. For example, the first electrode 100 may have, but is not limited to, a single-layered structure including ITO or a metal alloy (for example, a mixture of Ag and Mg), a two-layered structure including ITO/Mg or ITO/MgF, or a three-layered structure including ITO/Ag/ITO.

A pixel insulation film 110 may be disposed on an edge of the first electrode 100. The pixel insulation film 110 defines a pixel region, and may include an organic insulation material such as a silicon-based material, an inorganic insulation material, an organic-inorganic complex insulation material, or the like.

The hole transport region 200 may be disposed as a common layer on a plurality of first electrodes 100. The hole transport region 200 may be a region via which holes injected from the first electrode 100 reach the light-emitting unit 500.

The hole transport region 200 may include at least one of a hole injection layer, a hole transport layer, and a single-layer that has a hole injection function and a hole transport function at the same time. The hole transport region 200 may be formed of at least one of a hole injection material and a hole transport material.

When the hole transport region 200 includes the hole injection layer, the hole transport region 200 may include a phthalocyanine compound such as copper phthalocyanine, N,N'-diphenyl-N,N'-bis-[4-(phenyl-m-tolyl-amino)-phenyl]-biphenyl-4,4'-diamine (DNTPD), 4,4',4"-tris(3-methylphenylphenylamino)triphenylamine (m-MTDATA), 4,4'4"-tris(N,N-diphenylamino)triphenylamine (TDATA), 4,4',4"-tris{N,-(2-naphthyl)-N-phenylamino}-triphenylamine (2TNATA), poly(3,4-ethylenedioxythiophene)/poly(4-styrenesulfonate) (PEDOT/PSS), a polyaniline/dodecylbenzenesulfonic acid (PANI/DBSA), a polyaniline/camphor sulfonic acid (PANI/CSA), or polyaniline/poly(4-styrenesulfonate) (PANI/PSS), but is not limited thereto.

When the hole transport region 200 includes a hole transport layer, the hole transport region 200 may include a carbazole derivative such as N-phenyl carbazole or polyvinyl carbazole, a fluorine-based derivative, a triphenylamine-based derivative such as N,N'-bis(3-methylphenyl)-N,N'-diphenyl-[1,1-biphenyl]-4,4'-diamine (TPD) or 4,4',4"-tris (N-carbazolyl)triphenylamine (TCTA), N,N'-di(1- naphthyl)-N,N'-diphenylbenzidine (NPB), or 4,4'-cyclohexylidene bis[N,N-bis(4-methylphenyl)benzenamine (TAPC), but is not limited thereto.

The hole transport region 200 may have a thickness of about 100 Å to about 10,000 Å, for example, about 100 Å to about 1,000 Å. When the hole transport region 200 includes both the hole injection layer and the hole transport layer, the hole injection layer may have a thickness of about 100 Å to about 10,000 Å, for example, about 100 Å to about 1,000 Å. In addition, the hole transport layer may have a thickness of about 150 Å to about 2,000 Å, for example, about 100 Å to about 1,500 Å. When the thicknesses of the electron injection layer and the hole transport layer meet the aforementioned thickness range, a hole injection characteristic may be satisfactorily obtained without a substantial increase in driving voltage.

The hole transport region 200 may further include a charge generating material in order to improve conductivity in addition to the aforementioned materials. The charge generating material may be uniformly or non-uniformly dispersed inside the hole transport region. The charge generating material may be, for example, a p-type dopant material. The p-dopant material may be one of a quinone derivative, a metal oxide, and a cyano group-containing compound, but is not limited thereto. For example, non-limiting examples of the p-type dopant material may be quinone derivatives such as tetracyanoquinodimethane (TCNQ) and 2,3,5,6-tetrafluoro-tetracyanoquinodimethane (F4-TCNQ), and metal oxides such as a tungsten oxide and a molybdenum oxide, but are not limited thereto.

The hole transport region 200 may be formed by using various methods such as vacuum deposition, spin coating, casting, a Langmuir-Blodgett (LB) method, inkjet printing, laser printing, or laser induced thermal imaging (LITI).

The light-emitting unit 500 may be disposed on the hole transport region 200. The light-emitting unit 500 may have a single-layered structure including a single material, a single-layered structure including a plurality of different materials, or a multi-layered structure including a plurality of layers formed of a plurality of different materials.

The light-emitting unit 500 may be formed by using various methods such as vacuum deposition, spin coating, casting, a Langmuir-Blodgett (LB) method, inkjet printing, laser printing, or laser induced thermal imaging (LITI).

The light-emitting unit 500 may be formed of a typically available material, for example, a material that emits red, green, and blue light, but the exemplary embodiments are not so limited. In addition, the light-emitting unit 500 may include a fluorescent material or a phosphorescent material. Also, the light-emitting unit 500 may include a host material or a dopant material.

For example, the host material may include, but is not limited to, a typically available material, for example, tris (8-quinolinolato)aluminum (Alq3), 4,4'-bis (N-carbazolyl)-1,1'-biphenyl (CBP), poly(n-vinylcarbazole) (PVK), 9,10-di (naphthalene-2-yl)anthracene (ADN), 4,4',4"-tris(carbazol-9-yl)-triphenylamine (TCTA), 1,3,5-tris(N-phenylbenzimidazole-2-yl)benzene (TPBi), 3-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), or the like.

The light-emitting unit 500 may include a first light-emitting layer 510, a second light-emitting layer 520, and a third light-emitting layer 530. The first light-emitting layer 510 may be disposed on the first pixel region PA1. The second light-emitting layer 520 may be disposed on the second pixel region PA2. The third light-emitting layer 530 may be disposed on the third pixel region PA3.

In an exemplary embodiment, the first light-emitting layer 510 may emit red light. The first light-emitting layer 510 may include, for example, a fluorescent material including PBD:Eu(DBM)3(Phen)(tris(dibenzoylmethanato) phenanthoroline europium) or perylene. A dopant material included in the first light-emitting layer 510 may be selected from metal complexes such as bis(1-phenylisoquinoline) acetylacetonate iridium (PIQIr(acac)), bis(1-phenylquinoline)acetylacetonate iridium (PQIr(acac)), tris(1-phenylquinoline)iridium (PQIr), and octaethylporphyrin platinum (PtOEP), or an organometallic complex, but is not limited thereto.

In an exemplary embodiment, the second light-emitting layer 520 may emit green light. The second light-emitting layer 520 may include a florescent material that includes, for example, tris(8-hydroxyquinolino)aluminum (Alq3). The dopant material included in the second light-emitting layer 520 may be selected from, for example, a metal complex such as fac-tris(2-phenylpyridine)iridium (Ir(ppy)3) or an organometallic complex, but is not limited thereto.

In an exemplary embodiment, the third light-emitting layer 530 may emit blue light. The third light-emitting layer 530 may include a florescent material that includes any one selected from the group consisting of, for example, spiro-DPVBi, spiro-6P, distyryl-benzene (DSB), distyryl-arylene (DSA), a polyfluorene (PFO)-based polymer, and a poly(p-phenylene vinylene) (PPV)-based polymer. A dopant material included in the third light-emitting layer 530 may be selected from, for example, a metal complex such as (4,6-F2ppy)2Irpic or an organometallic complex, but is not limited thereto.

The common layer 300 may be disposed between the light-emitting unit 500 and the hole transport region 200. The common layer 300 may function to prevent electrons overflowing from the light-emitting unit 500 from being injected into the hole transport region 200. Also, the common layer 300 may function to guide holes so as to be easily injected into the light-emitting unit 500. Therefore, the common layer 300 may include both a hole transport material and an electron blocking material. The common layer 300 may function to prevent excess electrons passing through the light-emitting unit 500 from being moved toward the hole transport region 200, and thus, improve a longevity of the organic light-emitting diode (OLED of FIG. 2).

The hole transport material include in the common layer 300 may be substantially to the same as the material included in the hole transport region 200. For example, the common layer 300 may include a carbazole derivative such as N-phenyl carbazole or polyvinyl carbazole, a fluorine-based derivative, a triphenylamine-based derivative such as N,N'-bis(3-methylphenyl)-N,N'-diphenyl-[1,1-biphenyl]-4, 4'-diamine (TPD) or 4,4',4"-tris(N-carbazolyl)triphenylamine (TCTA), N,N'-di(1-naphthyl)-N,N'-diphenylbenzidine (NPB), 4,4'-cyclohexylidene bis[N,N-bis(4-methylphenyl) benzenamine (TAPC), or the like, but is not limited thereto.

The electron blocking material included in the common layer 300 is, but is not particularly limited to, a material having a high LUMO energy level higher than that of the light-emitting unit 500. For example, the electron blocking material may include triphenylamine, carbazole, spirodifluorene, oxadiazole, triazole, and phenanthroline, or a derivative of each of triphenylamine, carbazole, spirodifluorene, oxadiazole, triazole, and phenanthroline, but is not limited thereto.

The common layer 300 may have a thickness of about 50 Å to about 200 Å. When the thickness of the common layer 300 meets the aforementioned thickness range, a hole transporting characteristic and an electron blocking characteristic may be satisfactorily obtained without a substantial increase in driving voltage. Also, when a first p-type doped layer 410p described later is disposed on an entire region of the first resonance auxiliary layer 410, the first light-emitting layer 510 and the first p-type doped layer 410p are spaced apart from each other by the common layer 300. Therefore, a quenching of excitons generated in the first light-emitting layer 510 may be prevented.

The first resonance auxiliary layer 410 may be disposed on the first pixel region PA1. The second resonance auxiliary layer 420 may be disposed on the second pixel region PA2. The first resonance auxiliary layer 410 may be disposed between the common layer 300 and the hole transport region 200. In addition, the second resonance auxiliary layer 420 may be disposed between the common layer 300 and the second light-emitting layer 520.

The first resonance auxiliary layer 410, the second resonance auxiliary layer 420, and the common layer 300 may adjust a distance between the first electrode 100 and the second electrode 700. For example, a required resonance distance may be varied according to a wavelength of light emitted in the light-emitting unit 500. Therefore, a resonance distance of each of the first to third pixel regions PA1, PA2, and PA3 may be adjusted by using the first resonance auxiliary layer 410, the second resonance auxiliary layer 420, and the common layer 300.

Since the first light-emitting layer 510 and the second light-emitting layer 520 emit light beams having different wavelengths, the first resonance auxiliary layer 410 and the second resonance auxiliary layer 420 may have different thicknesses. For example, in an exemplary embodiment, a wavelength of light emitted in the first light-emitting layer 510 may be longer than that of light emitted in the second light-emitting layer 520. Therefore, the first resonance auxiliary layer 410 may be thicker than the second resonance auxiliary layer 420. However, the inventive concept is not limited thereto. For example, when resonance orders of red light and green light are different, the first resonance auxiliary layer 410 may be thinner than the second resonance auxiliary layer 420.

The first resonance auxiliary layer 410 may include a first p-type doped layer 410p. The second resonance auxiliary layer 420 may include a second p-type doped layer 420p. The first p-type doped layer 410p may be formed by doping a p-type dopant material into the first resonance auxiliary layer 410, and the second p-type doped layer 420p may be formed by doping the p-dopant material into the second resonance auxiliary layer 420. A hole injection barrier may be lowered by the first and second p-type doped layers 410p and 420p. Therefore, the driving voltage of the organic light-emitting diode (OLED of FIG. 2) may be lowered. Accordingly, the luminous efficiency of the organic electroluminescent display apparatus 1000 may be improved.

The first and second p-type doped layers 410p and 420p may be spaced apart from the light-emitting unit 500. For example, in an exemplary embodiment, the first and second p-type doped layers 410p and 420p may be disposed so as to be adjacent to the hole transport region 200. Therefore, since the first and second p-type doped layers 410p and 420p are spaced apart from the light-emitting unit 500, excitons generated in the light-emitting unit 500 may be prevented from being quenched by a P-dopant.

In an exemplary embodiment, the first p-type doped layer 410p is formed on a region adjacent to the hole transport region 200 of the first resonance auxiliary layer 410. However, in another exemplary embodiment, the first p-type doped layer 410p may be disposed on an entire region of the first resonance auxiliary layer 410. Even in this case, since the first light-emitting layer 510 and the first p-type doped layer 410p are spaced apart from each other by the common layer 300, excitons generated in the first light-emitting layer 510 may be prevented from being quenched by a P-dopant.

Doping concentrations of the first and second p-type doped layers 410p and 420p may be equal to or different from each other. For example, the first p-type doped layer 410p, which is disposed on the first pixel region PA1 having the thickest organic layer, may have a doping concentration higher than that of the second p-type doped layer 420p. In this case, the driving voltage of the organic light-emitting diode having a thick organic layer may be lowered, and as a result, power consumption of the organic electroluminescent display apparatus 1000 may be reduced. The organic layer may be defined as a layer disposed between the first electrode 100 and the second electrode 700.

With respect to the common layer 300, the first resonance auxiliary layer 410 may be disposed under the common layer 300. The second resonance auxiliary layer 420 may be disposed on the common layer 300. Therefore, the first and second resonance auxiliary layers 410 and 420 may be spaced apart from each other with the common layer 300 in-between.

That is, since the first and second p-type doped layers 410p and 420p are spaced apart from each other by the common layer 300, current may be prevented from leaking between the first and second p-type doped layers 410p and 420p.

When the common layer 300 does not exist unlike an embodiment of the inventive concept, the first and second p-type doped layers 410p and 420p may be disposed on the same layer. In this case, a shadow phenomenon may be generated during forming the first and second p-type doped layers 410p and 420p. When the shadow phenomenon is generated, the first and second p-type doped layers 410p and 420p may be not separated from each other, but be connected to each other. Accordingly, leakage current may flow between the first and second p-m type doped layers 410p and 420p connected to each other in the shadow phenomenon. The leakage current may cause more serious problems in driving organic light-emitting diodes having different driving voltages. For example, when a low gradation image is displayed, the organic light-emitting diode is driven by low current. When it is intended to drive an organic light-emitting diode having relatively high driving voltage at a low gradation, an organic light-emitting diode having relatively low driving voltage may emit light. Therefore, a color different from an intended color may be emitted to generate color abnormality. However, according to an embodiment of the inventive concept, the first and second p-type doped layers 410p and 420p may be spaced apart from and separated from each other by the common layer 300. That is, the common layer 300 may function as an insulation layer between the first and second p-type doped layers 410p and 420p. Accordingly, leakage current may be prevented from flowing between the first and second p-type doped layers 410p and 420p. As a result, when it is intended to drive an organic light-emitting diode having relatively high driving voltage at a low gradation, an organic light-emitting diode having relatively low driving voltage may be prevented from emitting light by the leakage current. That is to say, a color different from an intended color may be prevented from being emitted by the leakage current, and as a result, the display quality of the organic electroluminescent display apparatus 1000 may be improved.

The electron transport region 600 may be disposed on the light-emitting unit 500. The electron transport region 600 may be a region via which electrons injected from the second electrode 700 are in order to reach the light-emitting unit 500.

The electron transport region 600 may include, but is not limited to, at least one selected from a hole blocking layer, an electron transport layer, and an electron injection layer. For example, the electron transport region 600 may have a structure in which an electron transport layer and an electron injection layer; or an hole blocking layer, an electron transport layer, and an electron injection layer are sequentially stacked from the light-emitting unit 500, respectively, or may have a single-layered structure in which at least two layers are mixed into each other, but the inventive concept is not limited thereto.

When the electron transport region 600 includes the electron transport layer, the electron transport region 600 may include tris(8-hydroxyquinolinato)aluminum (Alq3), 1,3,5-Tri(1-phenyl-1H-benzo[d]imidazol-2-yl)phenyl (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-naphthalen-1-yl)-3,5-diphenyl-4H-1,2,4-triazolen (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), berylliumbis(benzoquinolin-10-olate) (Bebq2), 9,10-di(naphthalene-2-yl) anthracene (ADN), and a mixture thereof, but is not limited thereto.

The electron transport layer may have a thickness of about 100 Å to about 1,000 Å, for example, about 150 Å to about 500 Å. When the thickness of the electron transport layer meets the aforementioned thickness range, an electron transport characteristic may be satisfactorily obtained without a substantial increase in driving voltage.

When the electron transport region 600 includes the electron injection layer, the electron transport region 600 may use LiF, Lithium quinolate (LiQ), $Li_2O$, BaO, NaCl, a lanthanide group metal such as CsF or Yb, or metal halide such as RbCl or RbI, but is not limited thereto. The electron injection layer may be also formed of a material in which an electron transport material and an organo metal salt having an insulation property are mixed. The organo metal salt may be a material having an energy band gap of about 4 eV or more. Specifically, for example, the organo metal salt may include metal acetate, metal benzoate, metal acetoacetate, metal acetylacetonate, or metal stearate.

The electron injection layer may have a thickness of about 1 Å to about 100 Å, or about 3 Å to about 90 Å. When the thickness of the electron injection layer meets the aforementioned thickness range, an electron transport characteristic may be satisfactorily obtained without a substantial increase in driving voltage.

The electron transport region 600 may include a hole blocking layer as described above. The hole blocking layer may include, for example, at least one selected from 2,9-dimethyl-4,7-diphenyl-1,10-phenanthroline (BCP) and 4,7-diphenyl-1,10-phenanthroline (Bphen), but is not limited thereto. The hole blocking layer may have a thickness of about 20 Å to about 1,000 Å, for example, about 30 Å to about 300 Å. When the thickness of the hole blocking layer meets the aforementioned thickness range, an excellent hole blocking characteristic may be obtained without a substantial increase in driving voltage.

The electron transport region 600 may be formed by using various methods such as a vacuum deposition method, a spin coating method, a casting method, a Langmuir-Blodgett (LB) method, an inkjet printing method, a laser printing method, or a laser induced thermal imaging (LITI) method.

The second electrode 700 may be disposed on the electron transport region 600. The second electrode 700 may be a common electrode or a cathode electrode. Therefore, the second electrode 700 may be formed of a material having a low work function such that electrons are easily injected.

The second electrode 700 may include a single-layer or a multi-layer. The multi-layer may include at least one selected from a layer that is formed of a reflective material, and a layer that is formed of a transparent material. The second electrode 700 may be a reflective electrode, a semi-transparent electrode, or a transparent electrode. The second electrode 700 is not limited to any one embodiment, but may be formed of various materials according to a structure of the organic light-emitting diode OLED.

When the second electrode 700 is a semi-transparent electrode or a reflective electrode, the second electrode 700 may include Ag, Mg, Al, Pt, Pd, Au, Ni, Nd, Ir, Cr, lithium (Li), calcium (Ca), LiF/Ca, LiF/Al, molybdenum (Mo), titanium (Ti), a compound thereof, or a mixture thereof (for example, a mixture of Ag and Mg). Otherwise, the second electrode 700 may have a multi-layered structure that includes a reflective or a semi-transparent film formed of the aforementioned material, and a transparent conductive film formed of indium tin oxide (ITO), indium zinc oxide (IZO), zinc oxide (ZnO), indium tin zinc oxide (ITZO), or the like.

When the organic light-emitting diode (OLED of FIG. 2) is a top emission type, the first electrode 100 may be a reflective electrode, and the second electrode 700 may be a transparent electrode or a semi-transparent electrode. In this case, an organic capping layer (not shown) may be further disposed on the first electrode 100. The organic capping layer may have a refractive index of about 1.8 to about 2.4. Then organic capping layer may reflect light emitted in the light-emitting unit 500 theretoward. The reflected light is amplified inside the organic layer by a resonance effect, and thus may improve the luminous efficiency of the organic electroluminescent display apparatus 1000.

Figure 4:
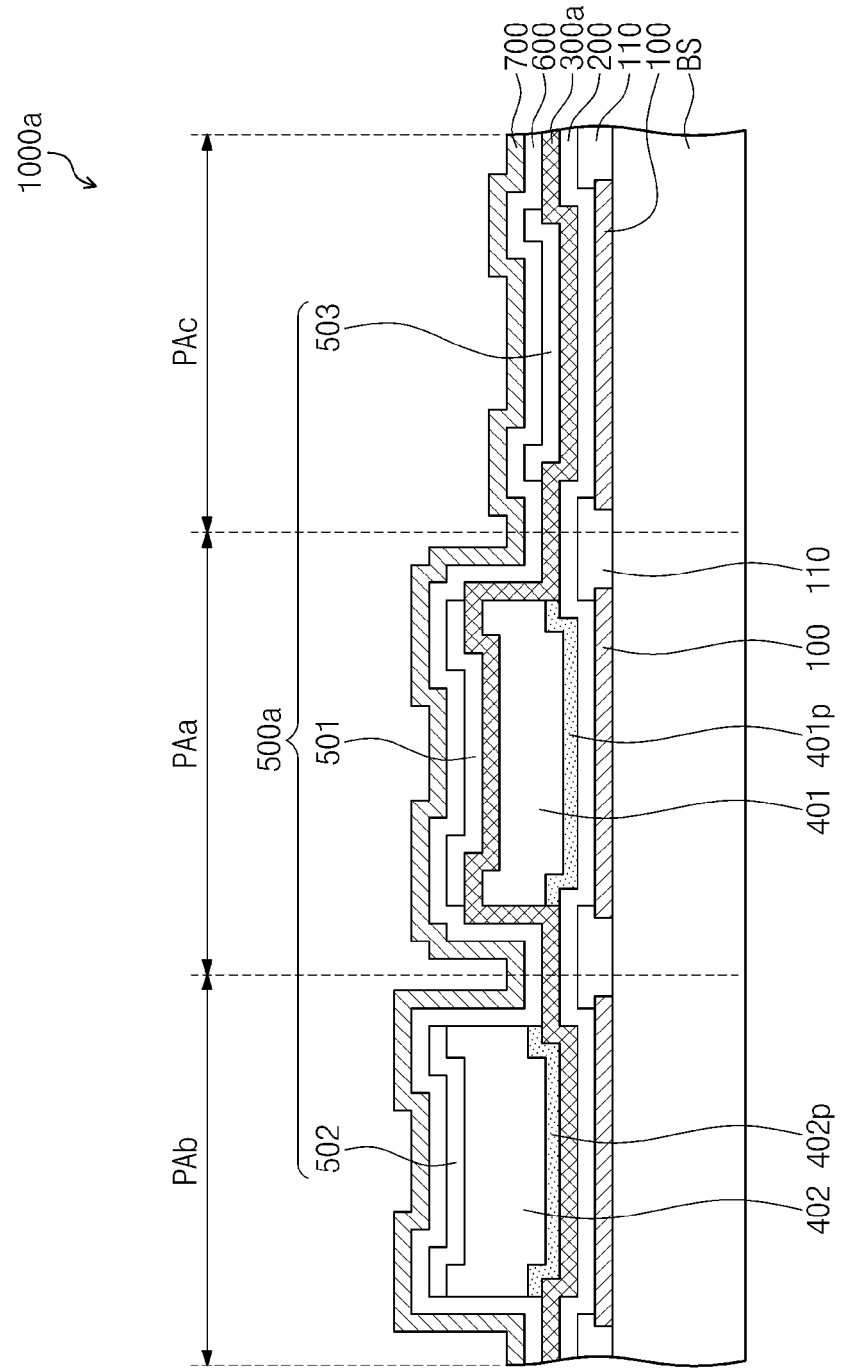
FIG. 4 is a schematic cross-sectional view illustrating a display apparatus according to another exemplary embodiment.

FIG. 4 is a schematic cross-sectional view illustrating a display apparatus according to another exemplary embodiment. In describing FIG. 4, the same reference numbers are used with respect to elements described with reference to FIG. 3, and a description with respect to substantially similar elements will not be repeated.

Referring to FIG. 4, the base substrate BS may include a first pixel region PAa, a second pixel region PAb, and a third pixel region PAc. A light-emitting unit 500a may include first to third light-emitting layers 501, 502, and 503 respectively disposed on the first to third pixel regions PAa, PAb, and PAc.

In an exemplary embodiment, the first to third light-emitting layers 501, 502, and 503 may emit green light, red light, and blue light, respectively. The light-emitting unit 500a may be formed of, but is not limited to, a material typically used, for example, a material that emits red, green, and blue light. In addition, the light-emitting unit 500a may include a fluorescent material or a phosphorescent material. Also, the light-emitting unit 500a may include a host material and a dopant material. The host material and the dopant material may include different materials according to a color of emitted light as described in FIG. 3. Since the host and dopant materials are described above, descriptions thereof will be omitted.

A common layer 300a may be disposed between the light-emitting unit 500a and the hole transport region 200. The common layer 300a may function to prevent electrons overflowing from the light-emitting unit 500 from being injected into the hole transport region 200. The common layer 300a may function to prevent excess electrons passing through the light-emitting unit 500a from being moved toward the hole transport region 200, and thus improve the longevity of the organic light-emitting diode (OLED of FIG. 2). Also, the common layer 300a may function to guide holes so as to be easily injected into the light-emitting unit 500a.

The first resonance auxiliary layer 401 may be disposed on the first pixel regions PAa. The second resonance auxiliary layer 402 may be disposed on the second pixel region PAb. The first resonance auxiliary layer 401 may be disposed between the common layer 300a and the hole transport region 200. In addition, the second resonance auxiliary layer 402 may be disposed between the common layer 300a and the second light-emitting layer 502.

The first resonance auxiliary layer 401 may include a first p-type doped layer 401p. The second resonance auxiliary layer 402 may include a second p-type doped layer 402p. The first p-type doped layer 401p may be formed by doping a p-type dopant material into the first resonance auxiliary layer 401, and the second p-type doped layer 402p may be formed by doping the p-dopant material into the second resonance auxiliary layer 402. A hole injection barrier may be lowered by the first and second p-type doped layers 401p and 402p. Therefore, the driving voltage of the organic light-emitting diode (OLED of FIG. 2) may be lowered. Accordingly, the luminous efficiency of the organic electroluminescent display apparatus 1000a may be improved.

With respect to the common layer 300a, the first resonance auxiliary layer 401 may be disposed under the common layer 300a. The second resonance auxiliary layer 402 may be disposed on the common layer 300a. Therefore, the first and second resonance auxiliary layers 401 and 402 may be spaced apart from each other with the common layer 300a in-between.

Since the first and second p-type doped layers 401p and 402p are spaced apart from each other by the common layer 300a, current may be prevented from leaking between the first and second p-type doped layers 401p and 402p. Accordingly, when a low gradation image driven by low current is displayed, the generation of spots may be prevented, so that the luminous efficiency of the organic electroluminescent display apparatus 1000a may be improved.

Figure 5:
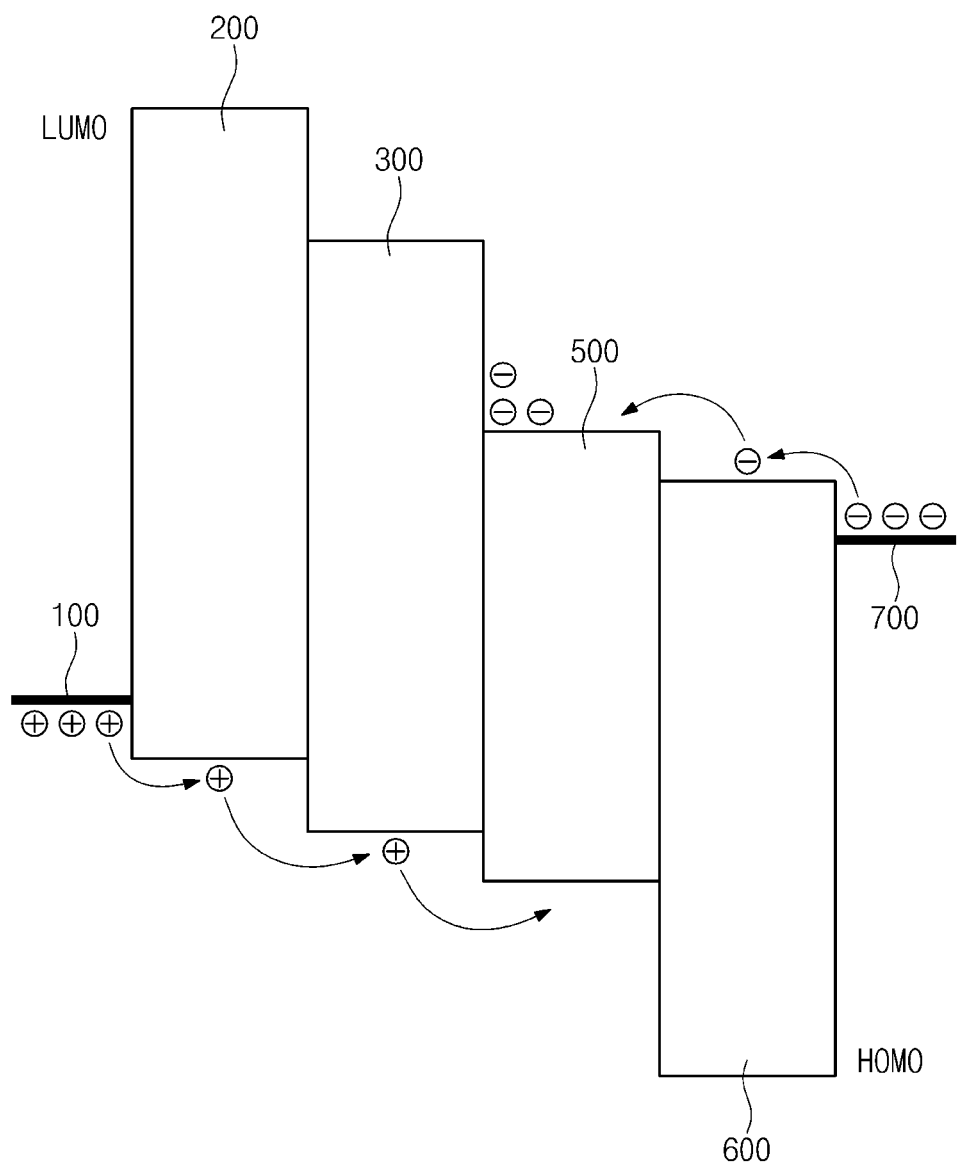
FIG. 5 is a band diagram of an organic light-emitting diode according to an exemplary embodiment.

FIG. 5 is a band diagram of an organic light-emitting diode according to an exemplary embodiment.

Referring to FIGS. 3 and 5, the organic light-emitting diode (OLED: see FIG. 5) may include layers having different energy bands.

Generally, intermolecular binding force of an organic material is relatively weak compared to an ionic bond or the like. Therefore, an electron energy level of any organic layer is quantized to be expressed as an energy band having a predetermined gap. An energy band of any organic layer may be defined as a gap between a lowest unoccupied molecular orbital (LUMO) energy level and a highest occupied molecular orbital (HOMO) energy level.

The LUMO energy level is the lowest energy level that is not filled with electrons, and may correspond to the energy level of the bottom of the conduction band in an inorganic semiconductor. The LUMO energy level corresponds to electron affinity of a relevant layer.

When a predetermined electric field is applied to the light-emitting diode (OLED of FIG. 2), electrons existing in the second electrode are transferred to an adjacent layer by the applied electric field. At this time, as a LUMO energy level gap between adjacent layers gets greater, a higher energy field is required.

The LUMO energy level is related to an electron transfer. Electrons may be transferred from a layer having a low LUMO energy level to a layer having a high LUMO energy level by the applied electric field. Generally, the electron transport region 600 has a LUMO energy level between a work function of the second electrode 700 (cathode) and a LUMO energy level of the light-emitting unit 500. Also, when the electron transport region 600 includes a plurality of layers, LUMO energy levels of the layers are progressively increased from the second electrode 700 to the light-emitting unit 500, but exemplary embodiments are not limited thereto.

The HOMO energy level is the highest energy level that is filled with electrons. The HOMO energy level may correspond to the energy level of the top of the valence band in an inorganic semiconductor. A HOMO energy level of any layer corresponds to ionization potential. The ionization potential is energy required for ionizing a material, and as ionization potential gets higher, the material is difficult to be ionized.

When a predetermined electric field is applied to the light-emitting diode (OLED of FIG. 2), holes existing in the first electrode 100 (anode) are transferred to an adjacent layer by the applied electric field. At this time, as a HOMO energy level gap between adjacent layers gets greater, a higher energy field is required.

The HOMO energy level is related to a hole transfer. Holes may be transferred from a layer having a high HOMO energy level to a layer having a low HOMO energy level by the applied electric field. Generally, the electron transport region 200 has a HOMO energy level between a work function of the first electrode 100 and a HOMO energy level of the light-emitting unit 500. Also, when the electron transport region 200 includes a plurality of layers, HOMO energy levels of the layers are progressively decreased from the first electrode 100 to the light-emitting unit 500, but exemplary embodiments are not limited thereto.

A HOMO energy level of the common layer 300 may be an intermediate value between a HOMO energy level of the hole transport region 200 and a HOMO energy level of the light-emitting unit 500. Therefore, holes may be easily transferred to the light-emitting unit 500 via the hole transport region 200 and the common layer 300.

Since the common layer 300 has a LUMO energy level higher than that of the light-emitting unit 500, the common layer may block excess electrons from being transferred from the light-emitting unit 500 to the hole transport region 200. Therefore, excitons may be more easily formed in the light-emitting unit 500, and as a result, the luminous efficiency of the organic light-emitting diode (OLED of FIG. 2) may be improved.

According to an exemplary embodiment, p-type doped layers disposed on different pixel regions may be separated from each other by a common layer. Therefore, current may be prevented from leaking through the p-type doped layer. Accordingly, since the p-type doped layers may be spaced from each other by the common layer, the p-type doped layer may be formed on all of an organic light-emitting diode disposed on a first pixel region and an organic light-emitting diode disposed on a second pixel region. As a result, a driving voltage of the organic light-emitting diode may be lowered to improve the luminous efficiency of the organic electroluminescent display apparatus. Also, a color different from an intended color may be prevented from being emitted by the leakage current, and as a result, the display quality of the organic electroluminescent display apparatus may be improved.

Also, according to an exemplary embodiment, the common layer may function to prevent electrons overflowing from the light-emitting unit from being injected into the hole transport region, and function to guide holes so as to be easily injected into the light-emitting unit. Accordingly, the longevity of the organic electroluminescent display apparatus may be improved.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. An organic electroluminescent display apparatus comprising:
   a base substrate comprising a first pixel region and a second pixel region;
   a first electrode disposed on the base substrate;
   a hole transport region disposed on the first electrode;
   a light-emitting unit disposed on the hole transport region, and comprising a first light-emitting layer disposed on the first pixel region and a second light-emitting layer disposed on the second pixel region;
   a common layer disposed between the light-emitting unit and the hole transport region;
   a first resonance auxiliary layer disposed on the first pixel region, and disposed between the common layer and the hole transport region;
   a second resonance auxiliary layer disposed on the second pixel region, and disposed between the second light-emitting layer and the common layer;
   an electron transport region disposed on the light-emitting unit; and
   a second electrode disposed on the electron transport region.

2. The organic electroluminescent display apparatus of claim 1, wherein the light-emitting unit further comprises a third light-emitting layer disposed on a third pixel region of the base substrate, and the third light-emitting layer is configured to emit light having a wavelength different from each of a wavelength of light emitted from the first light-emitting layer and a wavelength of light emitted from the second light-emitting layer.

3. The organic electroluminescent display apparatus of claim 2, wherein the first light-emitting layer is configured to emit red light, the second light-emitting layer is configured to emit green light, and the third light-emitting layer is configured to emit blue light.

4. The organic electroluminescent display apparatus of claim 2, wherein the first light-emitting layer is configured to emit green light, the second light-emitting layer is configured to emit red light, and the third light-emitting layer is configured to emit blue light.

5. The organic electroluminescent display apparatus of claim 1, wherein at least one layer selected from the first resonance auxiliary layer and the second resonance auxiliary layer comprises a p-type doped layer.

6. The organic electroluminescent display apparatus of claim 5, wherein the p-type doped layer is disposed adjacent to the hole transport region.

7. The organic electroluminescent display apparatus of claim 5, wherein the p-type doped layer is spaced from the light-emitting unit.

8. The organic electroluminescent display apparatus of claim 1, wherein the common layer has a lowest unoccupied molecular orbital (LUMO) energy level higher than a LUMO energy level of a host material of the light-emitting unit, and the common layer has a highest occupied molecular orbital (HOMO) energy level lower than a HOMO energy level of the hole transport region.

9. The organic electroluminescent display apparatus of claim 1, wherein the first resonance auxiliary layer and the second resonance auxiliary layer have different thicknesses, and a resonance distance between the first electrode and the second electrode is adjusted by the first resonance auxiliary layer, the second resonance auxiliary layer, and the common layer.

* * * * *